(12) United States Patent
Hirata et al.

(10) Patent No.: US 12,334,355 B2
(45) Date of Patent: Jun. 17, 2025

(54) PRESSURE CONTROL DEVICE

(71) Applicant: FUJIKIN INCORPORATED, Osaka (JP)

(72) Inventors: Kaoru Hirata, Osaka (JP); Kouji Nishino, Osaka (JP); Katsuyuki Sugita, Osaka (JP); Shinya Ogawa, Osaka (JP); Keisuke Ideguchi, Osaka (JP)

(73) Assignee: FUJIKIN INCORPORATED, Osaka (JP)

( * ) Notice: Subject to any disclaimer, the term of this patent is extended or adjusted under 35 U.S.C. 154(b) by 377 days.

(21) Appl. No.: 17/785,352

(22) PCT Filed: Dec. 3, 2020

(86) PCT No.: PCT/JP2020/045060
§ 371 (c)(1),
(2) Date: Jun. 14, 2022

(87) PCT Pub. No.: WO2021/131577
PCT Pub. Date: Jul. 1, 2021

(65) Prior Publication Data
US 2023/0011244 A1 Jan. 12, 2023

(30) Foreign Application Priority Data
Dec. 25, 2019 (JP) .................................. 2019-235252

(51) Int. Cl.
*G01F 1/34* (2006.01)
*G05D 16/20* (2006.01)
(Continued)

(52) U.S. Cl.
CPC ......... *H01L 21/3065* (2013.01); *G05D 16/20* (2013.01); *H01L 22/26* (2013.01);
(Continued)

(58) Field of Classification Search
CPC ............... F16K 37/005; F16K 37/0091; F16K 47/08–16; G05D 16/208; G05D 16/2073;
(Continued)

(56) References Cited

U.S. PATENT DOCUMENTS 4,858,643 A * 8/1989 Vavra .................... F15D 1/0005
137/486
5,669,408 A * 9/1997 Nishino ............... G05D 7/0635
137/486
(Continued)

FOREIGN PATENT DOCUMENTS

JP S58-101213 U 7/1983
JP H05-233068 A 9/1993
(Continued)

OTHER PUBLICATIONS

International Search Report issued in PCT/JP2020/045060; mailed Jan. 19, 2021.

*Primary Examiner* — Craig J Price
(74) *Attorney, Agent, or Firm* — Studebaker Brackett PLLC

(57) ABSTRACT

A pressure control device includes a pressure control valve, a flow resistance provided downstream of the pressure control valve, a first pressure sensor for measuring a gas pressure between the pressure control valve and the flow resistance, a second pressure sensor for measuring a gas pressure downstream of the flow resistance, and a calculation control circuit connected to the first pressure sensor and the second pressure sensor, wherein the pressure control device controls the gas pressure downstream of the flow resistance by adjusting an opening degree of the pressure control valve based on an output of the second pressure sensor regardless of an output of the first pressure sensor control, and calculates the flow rate of the gas downstream (Continued)

of the flow resistance, based on the outputs of the first and the second pressure sensors.

6 Claims, 8 Drawing Sheets

(51) Int. Cl.
    *H01L 21/3065*     (2006.01)
    *H01L 21/66*     (2006.01)
    *G01F 1/48*     (2006.01)

(52) U.S. Cl.
    CPC ............... *G01F 1/34* (2013.01); *G01F 1/48* (2013.01); *Y10T 137/7759* (2015.04); *Y10T 137/7761* (2015.04)

(58) Field of Classification Search
    CPC ....... G05D 7/06–0694; G05D 16/2013; G05D 16/2033; Y10T 137/7761; Y10T 137/7759; F16L 55/027–0279; H01L 22/26; H01L 21/3065; H01J 37/32; G01F 25/10; G01F 1/34; G01F 1/366; G01F 1/40–46; G01F 1/48
    USPC ............ 137/486, 487.5, 492; 700/282; 138/40–46
    See application file for complete search history.

(56) References Cited

U.S. PATENT DOCUMENTS

| | | | | |
|---|---|---|---|---|
| 5,816,285 | A * | 10/1998 | Ohmi | G05D 7/0635 137/486 |
| 6,539,968 | B1 * | 4/2003 | White | G05D 7/0635 138/44 |
| 6,964,279 | B2 * | 11/2005 | Ohmi | G05D 7/0635 137/486 |
| 9,494,947 | B2 * | 11/2016 | Hirata | G05D 7/0617 |
| 9,690,301 | B2 * | 6/2017 | Mudd | G05D 7/0635 |
| 9,733,649 | B2 * | 8/2017 | Nagase | G01F 15/005 |
| 9,791,867 | B2 * | 10/2017 | Nagase | G01F 1/50 |
| 9,921,089 | B2 * | 3/2018 | Ohmi | G01F 5/005 |
| 10,054,959 | B2 * | 8/2018 | Somani | G01F 15/005 |
| 10,503,179 | B2 * | 12/2019 | Hayashi | G05D 7/0635 |
| 10,663,337 | B2 * | 5/2020 | Penley | G01F 15/002 |
| 11,585,444 | B2 * | 2/2023 | Kovacic | F16K 1/526 |
| 11,639,865 | B2 * | 5/2023 | Penley | G05D 7/0635 138/40 |
| 11,841,036 | B2 * | 12/2023 | Penley | H01L 21/67017 |
| 11,899,477 | B2 * | 2/2024 | Barros | G05D 7/0658 |
| 2012/0209436 | A1 | 8/2012 | Takijiri et al. | |
| 2012/0227955 | A1 | 9/2012 | Koshimizu | |
| 2014/0182692 | A1 * | 7/2014 | Hirata | G01F 1/50 137/486 |
| 2016/0349763 | A1 | 12/2016 | Hirose et al. | |
| 2017/0212531 | A1 | 7/2017 | Nagase et al. | |
| 2017/0299456 | A1 | 10/2017 | Suzuki et al. | |
| 2018/0173249 | A1 | 6/2018 | Hayashi et al. | |
| 2018/0253111 | A1 | 9/2018 | Goto | |
| 2018/0328812 | A1 | 11/2018 | Fukushima et al. | |

FOREIGN PATENT DOCUMENTS

| | | |
|---|---|---|
| JP | H08-63235 A | 3/1996 |
| JP | H11-353032 A | 12/1999 |
| JP | 2011-119433 A | 6/2011 |
| JP | 2012-168823 A | 9/2012 |
| JP | 5710600 B2 | 4/2015 |
| JP | 2015-109022 A | 6/2015 |
| JP | 6237923 B2 | 11/2017 |
| JP | 6335229 B2 | 5/2018 |
| JP | WO2017/057129 A1 | 7/2018 |
| JP | WO2017/104643 A1 | 10/2018 |
| KR | 10-0173535 B1 | 4/1999 |
| TW | 2018-23901 A | 7/2018 |
| WO | 2010/132589 A2 | 11/2010 |
| WO | 2016/013172 A1 | 1/2016 |

* cited by examiner

PRESSURE CONTROL DEVICE

TECHNICAL FIELD

The present invention relates to a pressure control device, and in particular to a pressure control device capable of flow rate measurements.

BACKGROUND ART

Semiconductor manufacturing equipment such as a plasma CVD apparatus or an etching apparatus is provided with a supplying system of a heat-transfer cooling gas (also referred to as backside gas) to a backside of a processing substrate during a plasma process (e.g., Patent Document 1). The processing substrate may be a semiconductor wafer placed on a mount table in a process chamber. As the cooling gas, an inert gas such as He gas, Ar gas, or $N_2$ gas is generally used. The cooling gas can promote heat exchange between the back surface of the substrate and the mount table and thus the cooling gas is used to control a temperature of the substrate along with a. cooling water line for cooling the mount table.

The cooling gas supplied to the back surface of the substrate has a low pressure of 100 Torr (about 13.3 kPa) or less, for example. This is because of that, if the pressure of the cooling gas is high, the substrate which is sucked on the mount table by an electrostatic chuck or the like would float from the mount table. During the process, the inside of the process chamber may be maintained at a low pressure below 100 Torr, and the cooling gas pressure is also required to be similarly low, In addition, the cooling ability of the gas for the substrate is different depending on the supply pressure of the cooling gas. Specifically, by supplying a higher-pressure cooling gas to the back surface of the substrate, it is possible to further lower the substrate temperature. Thus, an accurate control of the pressure of the cooling gas is desired for the required cooling ability and a temperature of the back surface of the substrate.

Patent Document 1 discloses a control of the pressure of the cooling gas to a desired pressure by adjusting an opening degree of a pressure control valve and a downstream exhaust control valve, based on an output of a pressure transducer provided downstream of the pressure control valve. In addition, Patent Document 2 discloses a technique for feedback control of the pressure control valve based on an output of a downstream pressure sensor.

PRIOR-ART DOCUMENT

Patent Literature

Patent Document 1: Japanese Patent No. 6335229
Patent Document 2: Japanese Utility Model Publication No. S58-101213
Patent Document 3: Japanese Laid-Open Patent Publication No. 2012-168823
Patent Document 4: International Publication No. WO2017/104643
Patent Document 5: Japanese Laid-Open Patent Publication No. H05-233068
Patent Document 6: Japanese Laid-Open Patent Publication No. H08-63235
Patent Document 7: International Publication No. WO2016/013172

SUMMARY OF INVENTION

Problems to be Solved by Invention

Pressure adjustments of the supplied backside gas (cooling gas) can be performed by adjusting the opening degree of the pressure control valve as described above. However, depending on the chuck state of the substrate on the mount table, the backside gas may leak into the process chamber, and it is difficult to determine the leakage only by referring to the output of the pressure sensor provided downstream of the pressure control valve.

As a pressure control device capable of determining such leakage of the backside gas, the applicant of the present application manufactures and sells a pressure control device having a flow rate measurement function in which a built-in thermal flow rate sensor is provided upstream of the pressure control valve. In the pressure control device provided with a flow rate sensor, it is possible to control the pressure of the downstream backside gas to a desired value based on the output of the pressure sensor, and to measure the amount of leakage into the process chamber by monitoring the gas flow rate. The pressure control device provided with a thermal flow rate sensor is also disclosed in Patent Document 3, for example.

However, in recent years, the number of gas supply lines connected to the process chamber is increasing. Thus, a reduction of the installation space of the gas control instruments near the process chamber has become a major challenge. Therefore, the gas supply line and the interposed control instruments are required to be more compact than ever.

When the flow rates of the gases (e.g., He gas and Ar gas) supplied as the backside gas having different thermal conductivities are controlled individually, a plurality of gas lines may be connected to the backside of the substrate. In addition, different gas lines may be connected to a central and a peripheral portion of the substrate to control the temperature of the substrate back surface more precisely. For these purposes, each gas line must be equipped with a pressure control device, which increases the space required for placement. Furthermore, it is desirable to measure the pressure of the gas in the vicinity of the substrate by the pressure sensor, thus the pressure control device is not preferable to be positioned far from the process chamber.

Moreover, in order to improve the temperature uniformity of the substrate, a plurality of lines of the same backside gas may be provided, and each pressure may be controlled respectively. Therefore, further compactness of the pressure control device provided in each line is required, in particular, there is a demand for a pressure control device having a small width, which may be reduced to about 10 mm. If the width of the pressure control device can be reduced, multiple pressure control devices can be arranged side by side to effectively reduce space.

However, the conventional thermal flow rate sensor built in the pressure control device having a flow rate measurement function is configured to have a main body flow path provided with a laminar flow element, and a bypass flow path, which branches upstream of the laminar flow element and re-merges downstream of the laminar flow element, so that the flow rate passing through the main body flow path is proportional to the flow rate passing through the bypass flow path. Furthermore, by providing a heater in the bypass flow path, it reads a temperature difference between an inlet side and an outlet side of the gas flowing through there and converts it to a mass flow rate based on a change in the electrical resistance. Therefore, there is a limit to the compactness of the components. Some commercially available pressure control devices provided with thermal flow rate sensors have a width of 20 mm or more, although miniaturization has progressed. It is not easy to incorporate a unit having a thermal flow rate sensor with a substantially narrow width of about 10 mm. As a result, the valuable space in the vicinity of the process chamber is much consumed, especially when multiple gas line systems are provided.

The present invention has been made to solve the above-mentioned problems, and the main object is to provide a pressure control device having a compact design and capable of accurately controlling the downstream gas pressure while appropriately performing flow rate measurements.

Means for Solving Problem

The pressure control device according to an embodiment of the present invention includes a pressure control valve provided in a flow path, a flow resistance for restricting a gas flow provided downstream of the pressure control valve, a first pressure sensor for measuring a gas pressure of the flow path between the pressure control valve and the flow resistance, a second pressure sensor for measuring a gas pressure of the flow path downstream of the flow resistance, and an arithmetic control circuit connected to the first pressure sensor and the second pressure sensor, wherein the arithmetic control circuit is configured to control a gas pressure downstream of the flow resistance by adjusting an opening degree of the pressure control valve based on an output of the second pressure sensor regardless of an output of the first pressure sensor and calculate a flow rate of the gas flowing downstream the flow resistance based on outputs of the first pressure sensor and the second pressure sensor.

In an embodiment, the flow resistance is a laminar flow element.

In an embodiment, the flow resistance includes a columnar member, and a capillary structure provided in a hole penetrating in an axial direction of the columnar member.

In an embodiment, the columnar member has a recess for accommodating an enlarged diameter portion of the capillary structure on its end surface, and a resin gasket is provided between a bottom surface of the recess of the columnar member and a bottom surface of the enlarged diameter portion of the capillary structure.

In an embodiment, the flow resistance is a laminar flow element configured by laminating a plurality of plates each having a flow path.

In an embodiment, the pressure control valve is a piezoelectric element driven valve, each of the first pressure sensor and the second pressure sensor is a diaphragm type pressure sensor having a diaphragm as a pressure-sensitive portion and an elongated hole communicating to the diaphragm, any one of diameters of the pressure control valve, the first pressure sensor, the second pressure sensor, and the flow resistance is 10 mm or less.

In an embodiment, the pressure control device is connected to a supply flow path for supplying gas to a back surface of a substrate placed in a process chamber and is configured to control a gas pressure on the back surface of the substrate to a predetermined pressure, and to detect a leakage of gas from the back surface of the substrate into the process chamber based on a calculated flow rate.

In an embodiment, the pressure control device is configured so that a controlled gas pressure is to be between 1 and 100 Torr.

In an embodiment, the pressure control device includes a flow path block formed with flow paths by drilling, the pressure control valve and the first pressure sensor are arranged to face each other across the flow path block, wherein the flow paths formed in the flow path block include a first flow path extending from a central portion of a valve element of the pressure control valve toward the first pressure sensor, and a second flow path extending branched from the first flow path along a direction intersecting the first flow path, the flow resistance is provided in the second flow path.

The pressure control device according to an embodiment of the present invention includes a pressure control valve provided in a flow path, a flow resistance for restricting a gas flow provided downstream of the pressure control valve, a differential pressure sensor for measuring a differential pressure between a gas pressure of the flow path between the pressure control valve and the flow resistance, and a gas pressure of the flow path downstream of the flow resistance, any one of a first pressure sensor for measuring a gas pressure of the flow path between the pressure control valve and the flow resistance, and a second pressure sensor for measuring a gas pressure downstream of the flow resistance, and an arithmetic control circuit connected to the differential pressure sensor, and the first pressure sensor or the second pressure sensor, wherein the arithmetic control circuit is configured to control a gas pressure downstream of the flow resistance by adjusting an opening degree of the pressure control valve based on an output of the second pressure sensor, or based on outputs of the first pressure sensor and the differential pressure sensor, and to calculate a flow rate of a gas flowing downstream of the flow resistance based on the output of the differential pressure sensor and the first pressure sensor, or based on outputs of the differential pressure sensor and the second pressure sensor.

Effect of Invention

According to the embodiments of the present invention, a pressure control device having a compact design with small width and capable of flow rate measurement is provided.

DETAILED DESCRIPTION OF EMBODIMENT

Embodiments of the present invention will be described below with reference to the drawings, but the present invention is not limited to the following embodiments.

Figure 1:
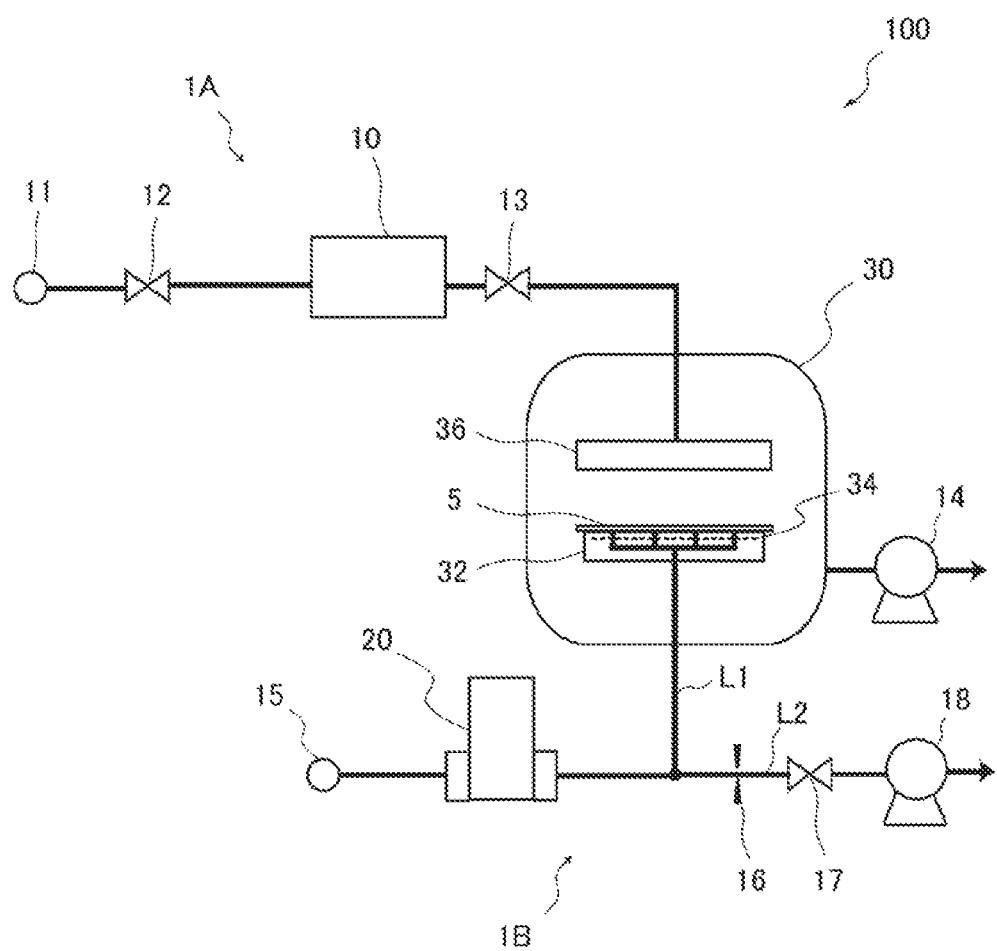
FIG. 1 is a diagram showing a semiconductor manufacturing system in which a pressure control device according to the embodiments of the present invention is incorporated in a backside gas supply system.

FIG. 1 shows a semiconductor manufacturing system 100 including a process gas supply system 1A and a backside gas supply system 1B. Each of the process gas supply system 1A and the backside gas supply system 1B is connected to a process chamber 30. Also connected to the process chamber 30 is a vacuum pump 14 that can depressurize the process chamber 30 and the flow path of the process gas supply system 1A.

To the process chamber 30, a substrate 5 such as a semiconductor wafer or a glass substrate is taken in and out by using a transport device (not shown) having a doorway on a side of the chamber. The substrate 5 transferred into the process chamber 30 is placed on a mount table 32 and is temporarily fixed to the mount table 32 by an optional suction device, here, an electrostatic chuck 34.

In order to supply the process gas to an upper surface of the substrate 5 placed on the mount table 32, the process gas supply system 1A has a gas supply source 11, an upstream valve 12, a flow rate controller 10, and a downstream valve 13. From the process gas supply system 1A, the process gas is uniformly supplied over the entire surface of the substrate 5 via a showerhead 36 at a controlled flow rate by the flow rate controller 10.

As the process gas, various types of gases such as raw material gases, etching gases, or the like, may be used. As the flow rate controller 10, a mass flow rate controller such as a pressure type flow rate controller or a thermal flow rate controller, is preferably used. As the upstream valve 12 and the downstream valve 13, an on-off valve having good shutoff properties and responsivity, for example, an air-operated valve (AOV), a solenoid valve, or an electric-operated valve (motor-operated valve) is preferably used.

Although only one process gas line is shown in FIG. 1, in another embodiment, a plurality of gas lines corresponding to each gas species may be connected to the process chamber 30 through a common gas line. When a plurality of gas lines is provided, the downstream valve 13 of each line is used for switching the gas species. Also, in order to supply the gas at different control flow rates to different locations, such as a center portion or a peripheral portion of the process chamber 30, a plurality of process gas lines may be connected to separate portion of the process chamber 30.

The backside gas supply system 1B is configured to supply a heat conducting backside gas to a back surface of the substrate 5 placed on the mount table 32. The backside gas supply system 1B includes a backside gas supply source 15 and a pressure control device 20 according to the present embodiment. The backside gas can be supplied to the back surface of the substrate 5 in the process chamber 30 at a controlled pressure controlled by the pressure control device 20. A heat conducting gas such as He gas, Ar gas, or $N_2$ gas is preferably used as the backside gas.

The backside gas supply system 1B has an exhaust line L2 downstream of the pressure control device 20. The exhaust line L2 is provided branched from the line L1 toward the process chamber 30. In the exhaust line L2, an orifice member (having an orifice diameter: 0.1 mm, 0.5 mm, etc.) 16, an exhaust valve 17, and a vacuum pump 18 are provided to exhaust the backside gas.

By providing the orifice member 16 in the exhaust line L2, it is possible to suppress a sudden pressure fluctuation when opening and closing the exhaust valve 17. Further, it is possible to continuously exhaust the backside gas at a small flow rate through the orifice member 16 when opening the exhaust valve 17. As a result, the pressure control by adjusting the opening degree of the valve of the pressure control device 20 can be performed more preferably. The diameter of the orifice may be appropriately selected in accordance with a required control pressure range of the backside gas.

In addition, it is not necessarily to provide the orifice member 16 in the exhaust line L2, and other restriction members or piezoelectric valves may be provided instead of the orifice member 16. Further, if a small amount of the backside gas is allowed to leak from the gap between the substrate 5 and the mount table 32 into the process chamber, a configuration of not proving the exhaust line L2 may be adopted.

Furthermore, although not shown, other cooling system is usually provided to the mount table 32. For example, a circulation of a refrigerant such as cooling water through a flow path formed in the mount table 32 prevents the mount table 32 and the substrate 5 from being too hot during the process. In the case of performing plasma processing, since the mount table 32 is heated to a high temperature, it is necessary to provide cooling system such as a cooling water line.

In such a configuration, by providing a heat conducting backside gas having a controlled pressure using the pressure control device 20 to the space between the mount table 32 and the back surface of the substrate 5, the temperature of the substrate 5 may be controlled accurately. Specifically, by supplying a backside gas at a higher pressure (e.g., 10 Torr to 100 Torr), heat exchange between the cooled mount table 32 and the substrate 5 is promoted, and the temperature of the substrate 5 can be further lowered. On the contrary, when the backside gas having a lower pressure (e.g., 1 Torr to 10 Torr) is supplied, the temperature of the substrate 5 becomes higher.

Since the substrate temperature varies in accordance with the pressure and thermal conductivity of the backside gas, the substrate temperature can be appropriately controlled by controlling the pressure of the backside gas using the pressure control device 20 (and the exhaust line L2). The pressure control device 20 is preferably configured so as to control the pressure of the backside gas within the range of 1 Torr to 100 Torr.

In addition, the temperature of the back surface of the substrate 5 can be measured by a temperature sensor such as a radiation thermometer (not shown). Based on the substrate temperature output by the temperature sensor, it is easy to maintain the substrate 5 at a desired temperature by appropriately changing the pressure controlled by the pressure control device 20.

Although only one system of the backside gas line is shown in FIG. 1, in another embodiment, a plurality of backside gas lines may be connected to the back surface of the substrate 5. A plurality of backside gas lines may be utilized to supply different species of gases having different thermal conductivities (e.g., He gas and Ar gas) and may be utilized to supply gas at different pressures at the center and rim of the substrate 5. The temperature uniformity of the substrate 5 can be improved by separately providing pressure-controlled gas to each location of the substrate 5.

As described above, although a plurality of backside gas lines can be provided, the pressure control device 20 according to the present embodiment provided in each line may be configured as a thin unit having a width of 10 mm or less, for example. For this reason, by arranging these lines side by side, a plurality of lines may be installed compactly as a whole. Thus, space-saving in the vicinity of the process chamber can be achieved.

It is possible to control the temperature of the substrate 5 using the pressure control device 20 as described above. However, since the gas is supplied to the back surface of the substrate 5 fixed on the mount table 32 using the suction device 34, depending on the suction state of the substrate 5, the backside gas may leak from the gap between the substrate 5 and the mount table 32 into the process chamber 30. The pressure control device 20 of the present embodiment includes a flow rate measurement function for detecting the backside gas leakage into the process chamber and measuring the leakage amount. Hereinafter, a detailed configuration of the pressure control device 20 having a flow measurement function will be described.

Figure 2:
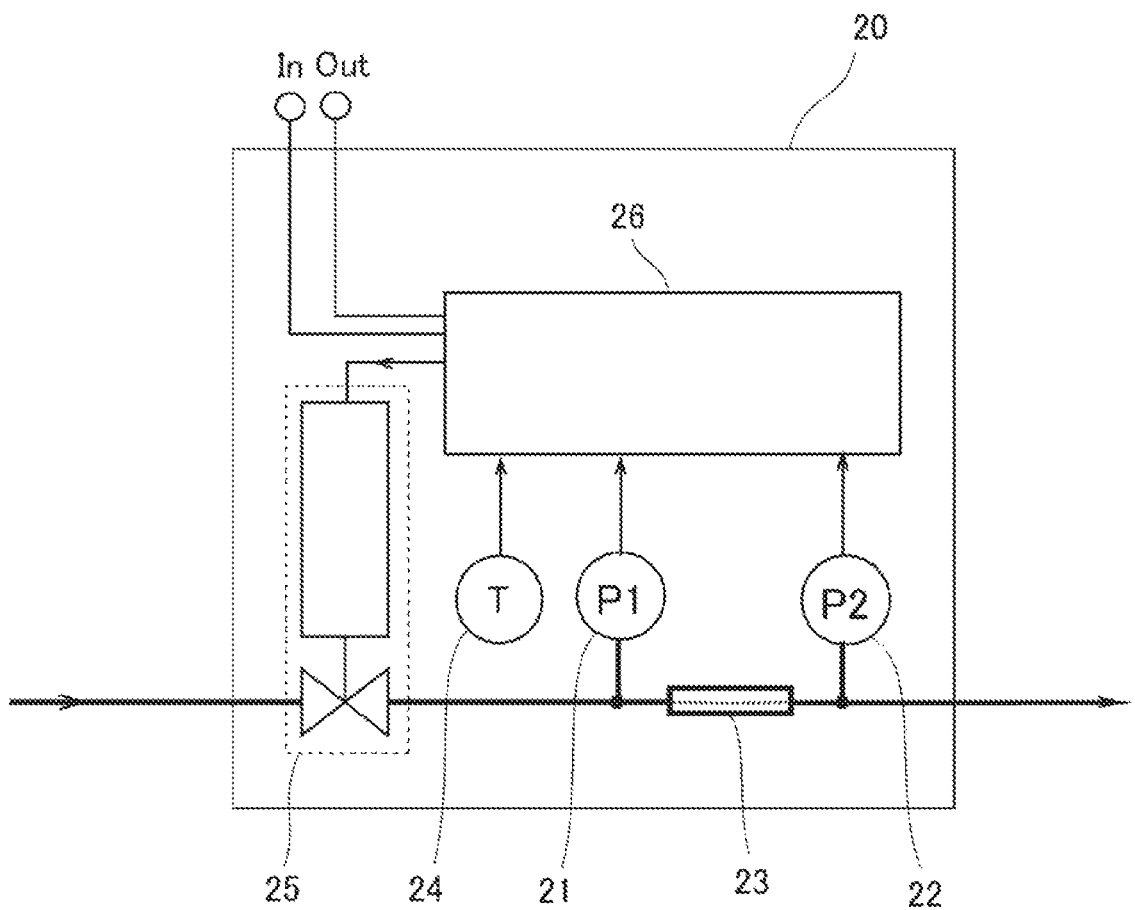
FIG. 2 is a diagram showing the pressure control device according to an embodiment of the present invention.

FIG. 2 is a diagram showing a. configuration of the pressure control device 20 of the present embodiment. The pressure control device 20 includes a pressure control valve 25 provided in the flow path communicating with the backside gas supply source 15 (refer to FIG. 1), a flow resistance 23 provided downstream of the pressure control valve 25 (various members capable of restricting the gas flow), a first pressure sensor (or an upstream pressure sensor) 21 connected to the flow path between the pressure control valve 25 and the flow resistance 23, and a second pressure sensor (or a downstream pressure sensor) 22 connected to the flow path downstream of the flow resistance 23.

The pressure control device 20 further includes a temperature sensor 24 for measuring the temperature of the gas, and an arithmetic control circuit 26 connected to the first pressure sensor 21, the second pressure sensor 22, and the temperature sensor 24. The arithmetic control circuit 26 is configured of a processor or a memory provided on a circuit board, etc., and includes a computer program for executing a predetermined arithmetic operation based on an input signal. The arithmetic control circuit 26 can be realized by a. combination of hardware and software. The illustrated arithmetic control circuit 26 is built into the pressure control device 20, but a portion (such as a CPU) or all of its components may be provided outside of the pressure control device 20 and configured so as to communicate with the pressure control device 20.

The pressure control device 20 is configured to adjust the opening degree of the pressure control valve 25 based on an output of the second pressure sensor 22 provided downstream of the flow resistance 23 (downstream pressure P2). More specifically, it is configured to feedback control the pressure control valve 25 so that the difference between the output of the second pressure sensor 22 and the set pressure approaches zero, that is, the output of the second pressure sensor 22 approaches the set pressure. Thus, it is possible to control the pressure of the backside gas supplied to the hack surface of the substrate 5 via the flow resistance 23 to a desired value.

Figure 3:
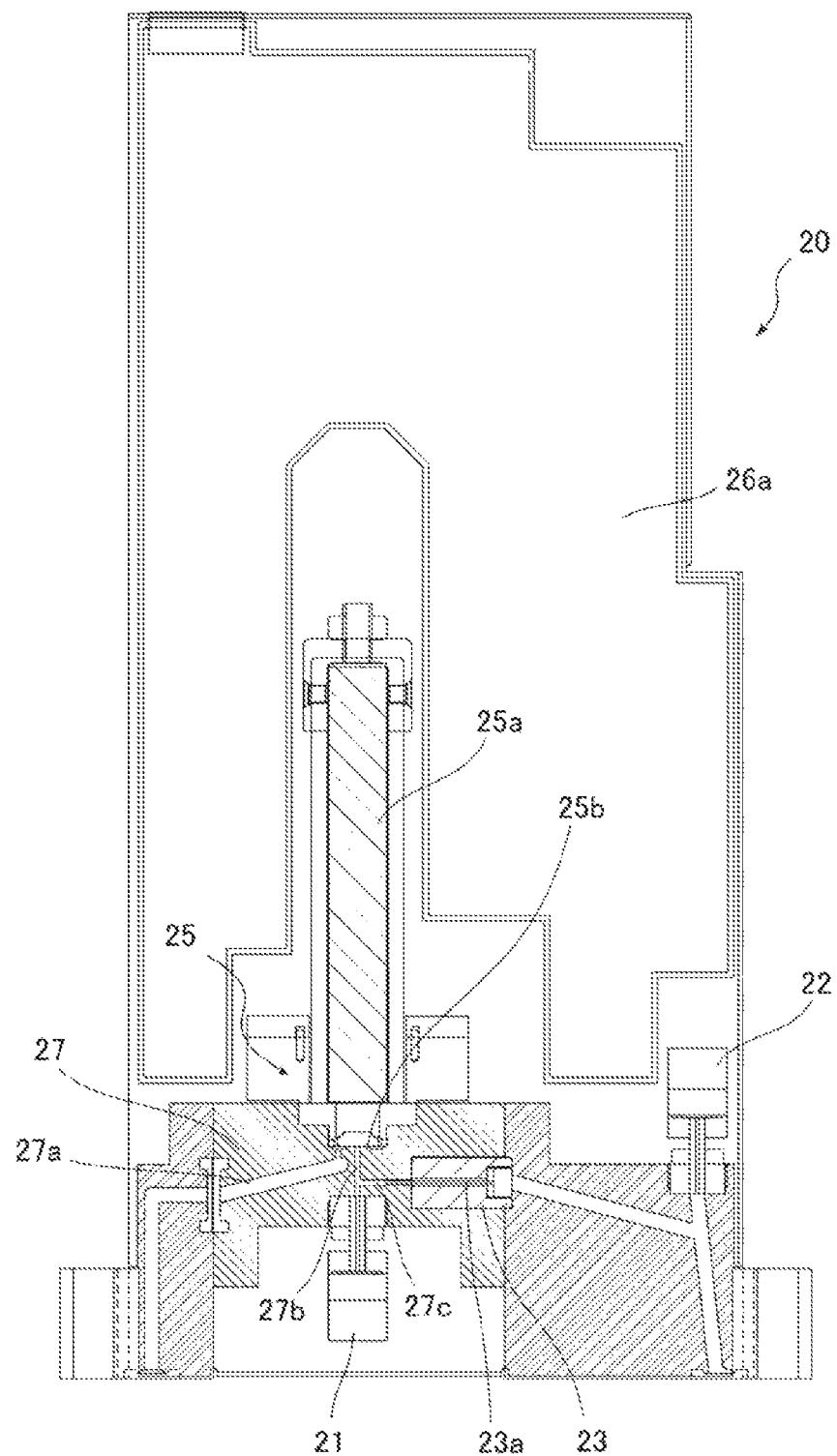
FIG. 3 is a diagram showing a more specific configuration example of the pressure control device according to an embodiment of the present invention.

As the pressure control valve 25. although various control valves with adjustable opening degrees are used, for example, a piezoelectric element driven valve (hereinafter, referred to as a piezo valve) as shown in FIG. 3 is preferably used. The piezo valve includes a metal diaphragm valve element 25b and a piezo actuator 25a, and the opening degree of the piezo valve can be adjusted to any opening degree by controlling the driving voltage to the piezoelectric element. The piezo valve is excellent in responsiveness and its miniaturization is also advancing. The piezo valve having a diameter less than 10 mm are readily available.

As the flow resistance 23, in the present embodiment, a laminar flow element having a capillary is used. However, the present invention is not limited to this, various structures for restricting the gas flow can be used as the flow resistance 23. As the flow resistance 23, a laminar flow element formed by a plurality of capillaries, an orifice plate, a sonic nozzle, or a restrictor constructed by laminating a plate having a groove for the flow path formed on the surface (which is used as a laminar flow element in a thermal flow meter) etc. may be used.

Furthermore, the pressure control device 20 is configured to determine the flow rate of the backside gas flowing downstream of the flow resistor 23, based on the output (upstream pressure P1) from the first pressure sensor 21 provided upstream of the flow resistance 23, and the output (downstream pressure P2) from the second pressure sensor 22 provided downstream of the flow resistor 23.

By measuring the upstream pressure P1 and the downstream pressure P2, it is possible to determine a flow rate. For example, since a laminar viscous flow is maintained when the gas flows through the capillary, the flow rate can be obtained according to the Poiseuille equation (1) below. In the equation (1) below, Q is the flow rate (sccm), K is a proportionality constant, P1 is the upstream pressure (Pa), and P2 is the downstream pressure (Pa).

$$Q = K \cdot (P1^2 - P2^2) \tag{1}$$

The proportional constant K is a constant depending on the species and temperatures of the gas and can be determined in advance by measuring the upstream pressure P1 and downstream pressure P2 when the target gas flows at a known accurate flow rate. The obtained proportionality constant K is stored in, for example, a memory of the arithmetic control circuit 26, and can be read out from the memory at the time of flow rate measurements.

In addition, Patent Document 4 discloses a gas leak inspection apparatus. In the pressure control device 20 of the present embodiment also, when using a capillary laminar flow element as the flow resistance 23, the flow rate can be obtained by using the following equation (2) as described in Patent Document 4. In equation (2) below, Q is the flow rate (Pa·m³/s). D is the inner diameter (m) of the capillary, L is the length (m) of the capillary, η is the viscosity coefficient (Pa·s) of the gas, and P1 and P2 are the upstream and downstream pressures (Pa).

$$Q = (\pi D^4 / 128 \eta L) \times ((P1+P2)/2) \times (P1-P2) \tag{2}$$

Thus, in the pressure control device 20 of the present embodiment, together with providing the flow resistance 23, by providing not only the second pressure sensor 22 used for pressure control but also the first pressure sensor 21 for measuring the upstream pressure P1, it is possible to not only control the downstream pressure P2 but also detect the leakage of the backside gas and measure the leakage amount.

Patent Documents 5 and 6 each discloses a differential pressure type mass flow controller configured to control a control valve based on a difference between an upstream pressure and a downstream pressure of an orifice member or a laminar flow element. However, the mass flow controllers described in Patent Documents 5 and 6 are devices used for flow rate control, but not pressure control devices configured to control the downstream pressure. Also, in the pressure control device of the present embodiment, when using an element other than the capillary laminar flow element as the flow resistance 23, instead of measuring the flow rate based on the above equation (1) or (2), the flow rate may be determined by applying various methods adopted in a conventional differential pressure flow meter.

Hereinafter, a specific design example of the pressure control device 20 will be described with reference to FIGS. 3 and 4.

The pressure control device 20 shown in FIG. 3 has a flow path block 27 to which a piezo actuator 25a and a diaphragm valve element 25b constituting the piezo valve (pressure control valve 25) are attached. In the pressure control device 20, a circuit board 26a having the arithmetic control circuit 26 (see FIG. 2) is also provided.

Figure 4:
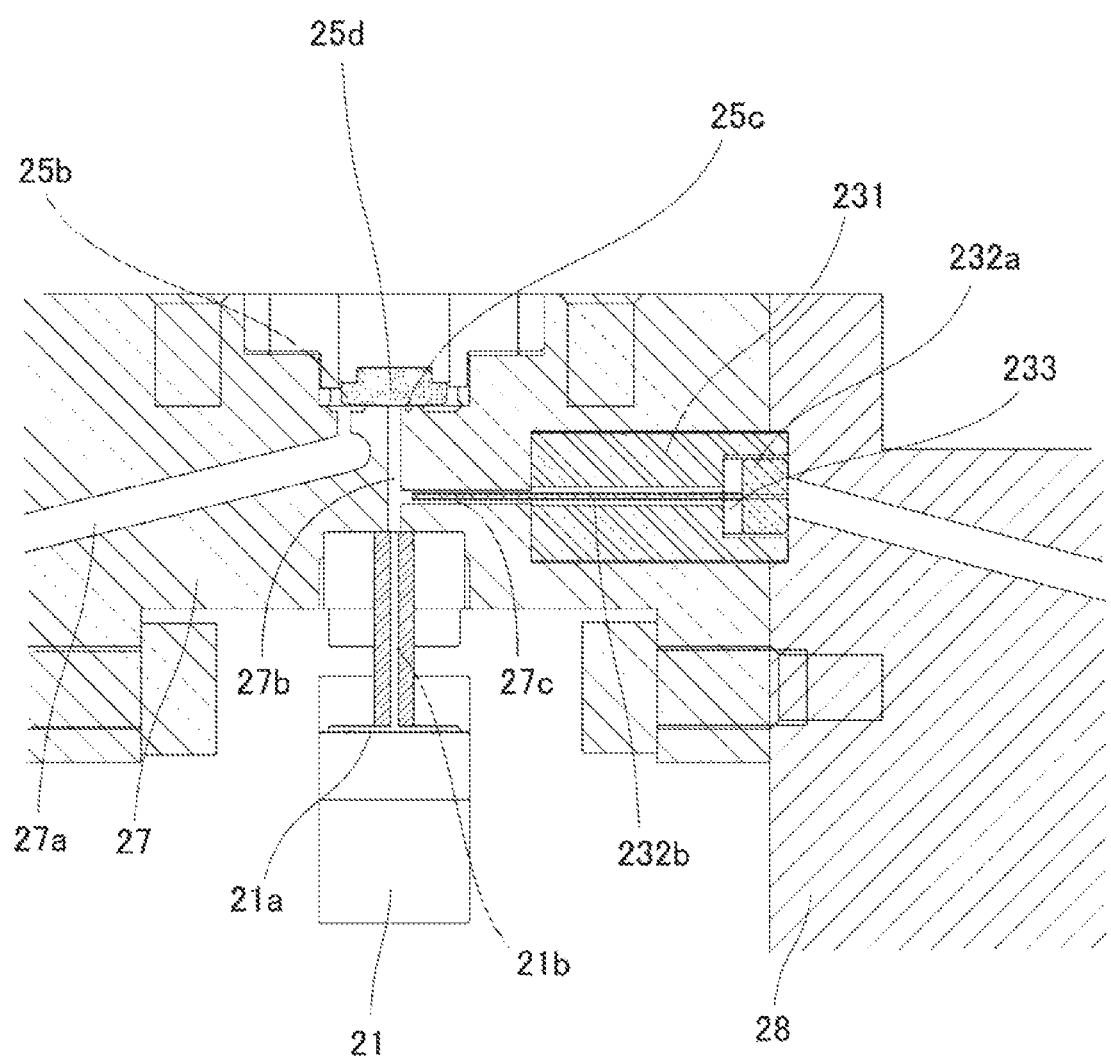
FIG. 4 is an enlarged view of the vicinity of the flow resistance provided in the pressure control device shown in FIG. 3.

As shown in FIG. 4, in the flow path block 27, an annular sheet 25c contactable to the diaphragm valve element 25b is formed. It is possible to control the piezo valve to a desired opening degree by changing the pressing force of a valve element pressing member 25d toward the sheet 25c by driving the piezo actuator 25a.

As shown in FIG. 3, the flow path block 27 is provided with flow paths 27a, 27b, and 27c formed by drilling using a drill or the like. The flow path 27a is a primary side flow path for communicating the backside gas supply source 15 (see, FIG. 1) with the pressure control valve 25. The flow path 27b (sometimes referred to as a first flow path) is a flow path for communicating the pressure control valve 25 with the first pressure sensor 21. The flow path 27c (sometimes referred to as a second flow path) extends from the middle of the first flow path 27b in the cross direction (here a direction perpendicular to the first flow path 27b) and is allow path for communicating the pressure control valve 25 with the flow resistance 23.

In the present embodiment, the pressure control valve 25 and the first pressure sensor 21 are arranged so as to face each other sandwiching the flow path block 27 on the upper and lower surfaces of the flow path block 27. Then, the first flow path 27b, extends vertically from the central portion of the diaphragm valve element 25b of the pressure control valve 25 (or inside the annular sheet 25c) straight toward the first pressure sensor 21. On the other hand, the primary side flow path 27a is connected to the valve chamber outside the sheet 25c at the peripheral portion of the diaphragm valve element 25b of the pressure control valve 25.

In addition, as shown in FIG. 4, the first pressure sensor 21 has an elongated hole 21b communicating with the first flow path 27b, and a diaphragm 21a provided as a pressure sensitive portion at the tip of the elongated hole 21b. Thus, by placing the sensor unit isolated from the flow path block 27 through the elongated hole 21b of the pressure introducing pipe, it is possible to reduce the mount space of the first pressure sensor 21 to the flow path block 27. As a result, it is possible to design the entire diaphragm pressure sensor to have a small diameter. The second pressure sensor 22 also has the same configuration as described above and is designed to have a small diameter.

As the first pressure sensor 21 and the second pressure sensor 22, the one described in Patent Document 7 (WO2016/013172) by the applicant of the present application can be used, for example. The diameter of the pressure sensor disclosed in Patent Document 7 is about 8 mm, which is less than 10 mm. The first and second pressure sensors 21 and 22 may incorporate the diaphragm 21a, and a sensor chip disposed in a space where pressure changes due to deformation of the diaphragm 21a. The sensor chip is formed of, for example, silicon single crystal, and is able to derive the measured pressure as an electrical signal (resistance value change of the strain gauge) by attaching a strain gauge to the thin plate portion formed as a pressure sensitive portion.

Furthermore, as shown in FIG. 3, the flow resistor 23 provided in the second flow path 27c has a capillary 23a. More specifically, as shown in FIG. 4, the flow resistance 23 is configured of a long gasket (columnar member) 231 made of metal, capillary structures 232a and 232b made of metal, and a gasket 233 made of resin provided between the long gasket 231 and the enlarged diameter portion 232a of the capillary structure. The gasket 233 is made of PCTFE (polychlorotrifluoroethylene), for example.

The long gasket 231 is accommodated and fixed inside a bottomed horizontal hole provided on the end surface of the flow path block 27, the bottomed horizontal hole being formed so as to communicate with the second flow path 27c. In addition, a through hole is provided along the axial direction of the long gasket 231 and the capillary portion 232b of the capillary structure is inserted therein. Furthermore, a concave portion capable of accommodating the enlarged diameter portion 232a of the capillary structure and the gasket 233 is provided on the outer end surface of the long gasket 231. The gasket 233 is provided between the bottom surface of the concave portion of the long gasket 231 and the bottom surface of the enlarged diameter portion 232a of the capillary structure.

In the present embodiment, the capillary portion 232b of the capillary structure passes through the through hole of the long gasket 231 and extends to the middle of the second flow path 27c formed in the flow path block 27. In addition, the enlarged diameter portion 232a of the capillary structure is connected to a flow path formed in a downstream flow path block 28, so that the gas passing through the capillary flows downstream.

By using the flow resistance 23 described above, it can be assumed that a laminar viscous gas flows through the capillary. Therefore, the flow rate measurements can be suitably performed based on the outputs of the first pressure sensor 21 and the second pressure sensor 22. The size of the capillary is designed to be, for example, 0.25 mm in diameter and 20 mm in length, and the diameter of the flow resistance 23 (or long gasket 231) is designed to be less than 10 mm in size (e.g., 3-8 mm).

In the pressure control device 20 configured as described above, since the pressure control valve 25, the first pressure sensor 21, and the flow resistance 23 are compactly installed to the flow path block 27, miniaturization may be achieved. In addition, by placing the flow resistance 23 at the end portion of the flow path block 27 (the interface with the downstream flow path block 28), exchanging feasibility of the flow resistance 23 is improved, and it is easy to change the capillary dimensions as appropriate depending on the required flow measurement range and the control pressure range. It is also easy to replace the capillary when it is clogged.

Furthermore, in the above configuration, the pressure control valve 25, the first pressure sensor 21, the flow resistance 23, and the second pressure sensor can be arranged on the same plane (the plane passing through the middle in the width direction of the flow path block 27 in parallel with the drawings). Since any one of them is configured to a small diameter, it is possible to design the pressure control device 20 to have a small width. Thus, the pressure control device 20 having a width of 10 mm or less is achievable.

In this manner, the pressure control device 20 is capable of not only appropriately controlling the downstream pressure P2 (supply pressure of the backside gas), but also measuring the leakage amount of the gas from the back surface of the substrate into the process chamber based on the flow measurement result. The measurement of the leakage amount can typically be performed by comparing the flow rate with the normal flow rate at the set downstream pressure at the normal time and considering the increasing amount as the leak flow rate when the flow rate increases at the same set downstream pressure. The pressure control device 20 is configured to be able to precisely control the pressure (downstream pressure P2) of the backside gas, particularly within 1 to 100 Torr. Thus, the substrate can be cooled to a desired temperature.

Here, in order to accurately measure the flow rate even when the controlled downstream pressure is in a low-pressure range such as 1 to 100 Torr, it is advantageous to determine a lower flow rate near the lower limit of the differential pressure $\Delta P$ (=P1−P2) that is detectable by the first pressure sensor 21 and the second pressure sensor 22. In other words, it is advantageous for the pressure control device to be configured in such a way that a large value can be detected as the differential pressure $\Delta P$ even at a low flow rate.

Although the leakage amount of the backside gas is a small amount, if the differential pressure $\Delta P$ detected is large at the same flow rate, it is possible to measure the flow rate more accurately. The present inventors have made intensive studies, and found that as the flow resistance, rather than using an orifice member, using a capillary laminar flow element can detect a large differential pressure even at the same flow rate. Thus, using a capillary laminar flow element enables more accurate measurement of the leakage amount at a lower flow rate.

Figure 5:
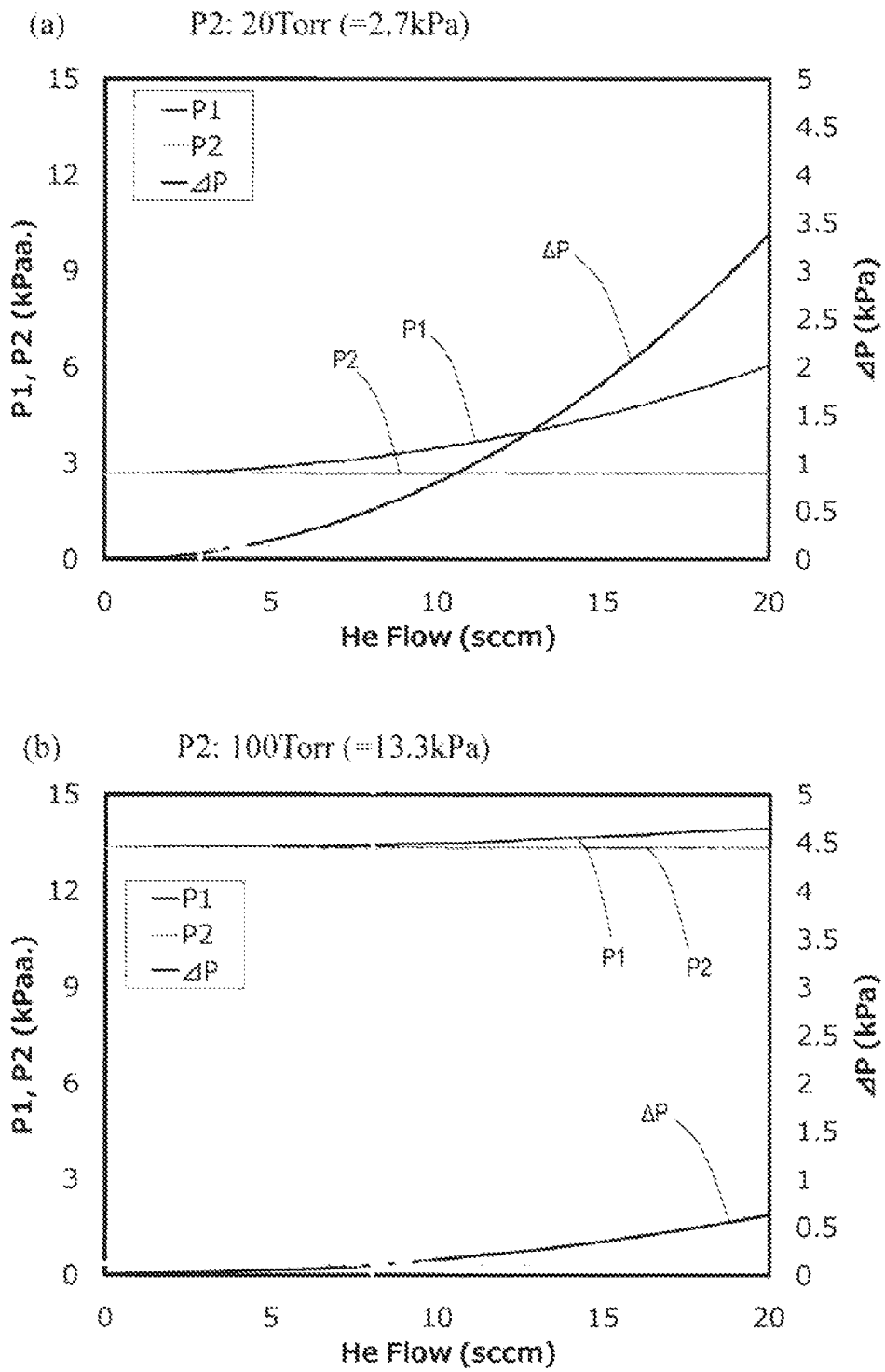
FIG. 5 is a graph showing the relationship between the upstream pressure P1, the downstream pressure P2, the differential pressure ΔP(=P1−P2), and the flow rate, when using an orifice plate as the flow resistance, and (a) and (b) show the case where the downstream pressure is 20 Torr and 100 Torr, respectively.
Figure 6:
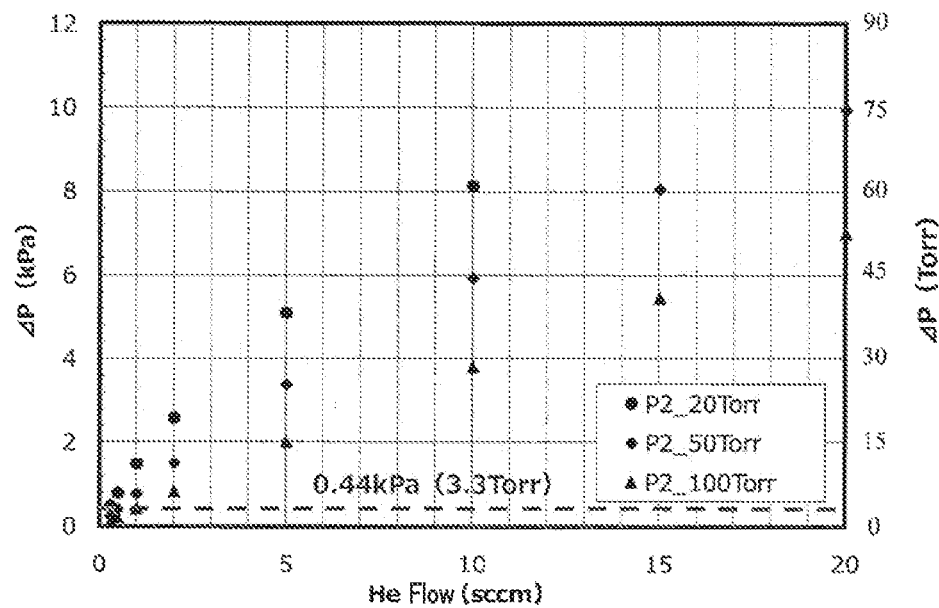
FIG. 6 is a graph showing the relationship between the upstream pressure P1, the downstream pressure P2, the differential pressure ΔP, and the flow rate, when using a laminar element having a capillary as the flow resistance.
Figure 7:
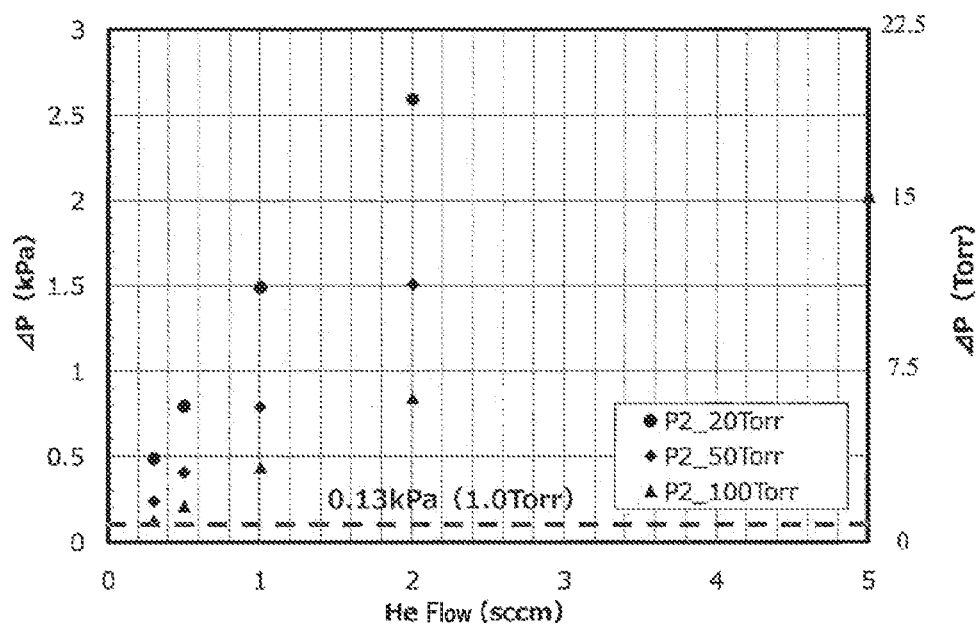
FIG. 7 is an enlarged graph of the low flow rate range shown in the graph of FIG. 6.

FIG. 5 is a graph showing the relationship between the He flow rate and the pressures (upstream pressure P1, downstream pressure P2 and differential pressure $\Delta P$), when using the orifice plate as the flow resistance 23. FIG. 5(a) shows the case where the downstream pressure P2 is 20 Torr and FIG. 5(b) shows the case where the downstream pressure P2 is 100 Torr. In addition, FIGS. 6 and 7 are graphs showing the relationship between the He flow rate and the differential pressure $\Delta P$=(P1−P2), when using a capillary laminar flow element as the flow resistor 23. FIG. 7 shows an enlarged view of the low flow rate range (0 to 5 sccm) of the graph shown in FIG. 6.

As the flow resistance 23, in each case where an orifice plate is used and where a capillary laminar flow element is used, an element designed to flow the gas at 400 sccm when the control valve is fully opened and the supplying pressure upstream of the pressure control valve is set to 100 kPa abs (note that the downstream of the flow resistance is depressurized). Since the flow resistance 23 is provided in the flow path, it is required to have the ability to flow the gas at a predetermined flow rate or higher.

As can be seen from FIGS. 5(a) and 5(b), in the case where the orifice plate is used, when $\Delta P$ is 0.1 kPa (=0.75 Torr), helium gas of about 2.7 sccm flows when the downstream pressure P2 is 20 Torr, helium gas of about 8.1 sccm flows when the downstream pressure P2 is 100 Torr. That is, if the detectable lower limit value of $\Delta P$ based on the measurement capability of the pressure sensor is estimated to be 0.1 kPa, as much as about 2.7 sccm gas flows even when the downstream pressure P2 is 20 Torr. Therefore, when the downstream pressure P2 is equal to or higher than 20 Torr, it is difficult to accurately measure the flow rate of the gas flowing at a flow rate of less than 2.7 sccm from the output of the pressure sensor.

On the other hand, as shown in FIG. 6, in the case where the capillary laminar flow device is used, even when the differential pressure $\Delta P$ is about 0.44 kPa, which greatly exceeds the detectable lower limit value of 0.1 kPa, the gas flows at a flow rate of only about 1 sccm under the condition where the downstream pressure P2 is 100 Torr. In addition, as can be seen from the graphs when the downstream pressures P2 are 20 Torr and 50 Torr, when the lower downstream pressure P2 is lower, and when the differential pressure $\Delta P$ is 0.44 kPa, it can be seen that the gas flows only at a flow rate of less than 1 sccm. Therefore, when the downstream pressure P2 is 20 to 100 Torr, the flow rate of the gas flowing less than 1 sccm can be satisfactorily measured using the first and second pressure sensors.

As can be seen from the enlarged view shown in FIG. 7, even when the downstream pressure P2 is 100 Torr, the gas flows only at a flow rate of about 0.3 sccm when the differential pressure $\Delta P$ is in the vicinity of the detectable lower limit value of 0.1 kPa (0.13 kPa). Thus, if the downstream pressure P2 is less than or equal to 100 Torr, the flow rate of the gas flowing at 0.3 sccm or more can be measured relatively accurately using the first and second pressure sensors. Therefore, even when the leak flow rate is small, by using the capillary laminar flow element, the detection of the leakage and measurement of the leak flow rate can be appropriately performed.

From the above description, it is considered to be advantageous to use the capillary laminar flow element than the orifice plate to measure the leakage of a small flow rate based on the differential pressure. This is considered to be because, as can be seen from FIGS. 6 and 7, when the capillary laminar flow element is used, there is a characteristic that the differential pressure $\Delta P$ increases relatively large with only a slight flow of gas from 0 sccm, whereas when the orifice plate is used, as can be seen from FIG. 5, there is a characteristic that the differential pressure $\Delta P$ increases only a little even if the gas flows slightly from 0 sccm.

In addition, since it is expected to show the similar characteristics as shown in FIGS. 6 and 7 as long as a laminar flow element is used, a laminar flow element provided with a plurality of capillaries may be used as the flow resistance 23, and a laminar flow element constructed by laminating plates formed of flow paths is also suitable to be used as the flow resistance 23.

Figure 8:
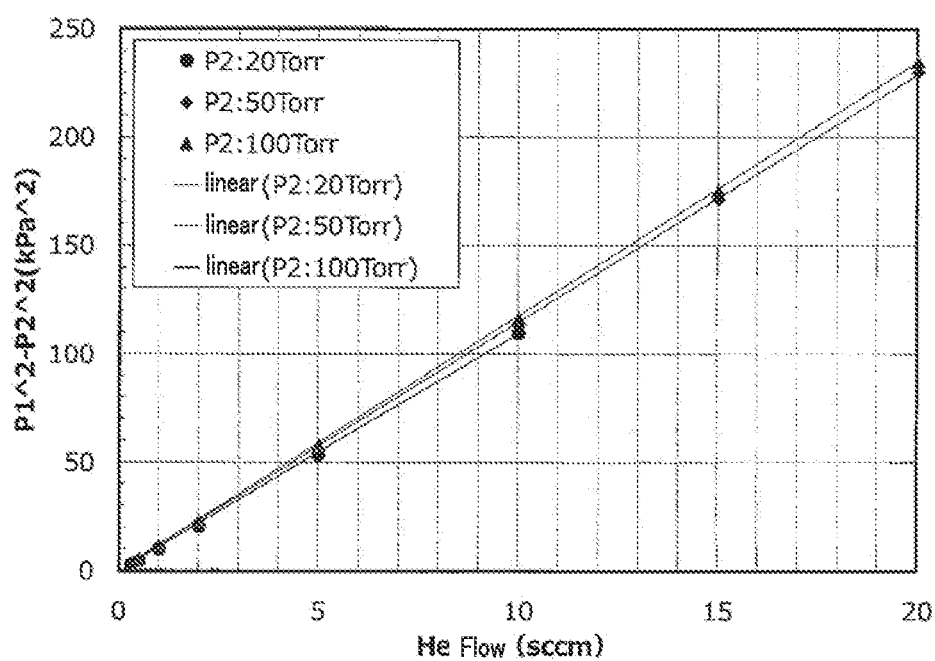
FIG. 8 is a graph showing the relationship between the flow rate corresponding value ($P1^2-P2^2$) based on the upstream pressure P1 and downstream pressure P2 and the actual measured flow rate, when using a laminar flow element having a capillary as the flow resistance.

FIG. 8 is a graph showing the relationship between the He flow rate and the term of pressure (P1$^2$−P$^2$) in the above Poiseuille equation (1). This graph is made based on the data shown in FIGS. 6 and 7.

As can be seen from the graph shown in FIG. 8, the term of pressure (P1$^2$−P2$^2$) and the flow rate are approximately proportional over a wide flow rate range, i.e., even in the low flow rate range. Therefore, together with using a capillary laminar flow element as the flow resistance 23, by obtaining the flow rate by calculation from the output results of the first and second pressure sensors based on the Poiseuille equation (1), it is considered that the leak flow rate can be accurately determined.

Figure 9:
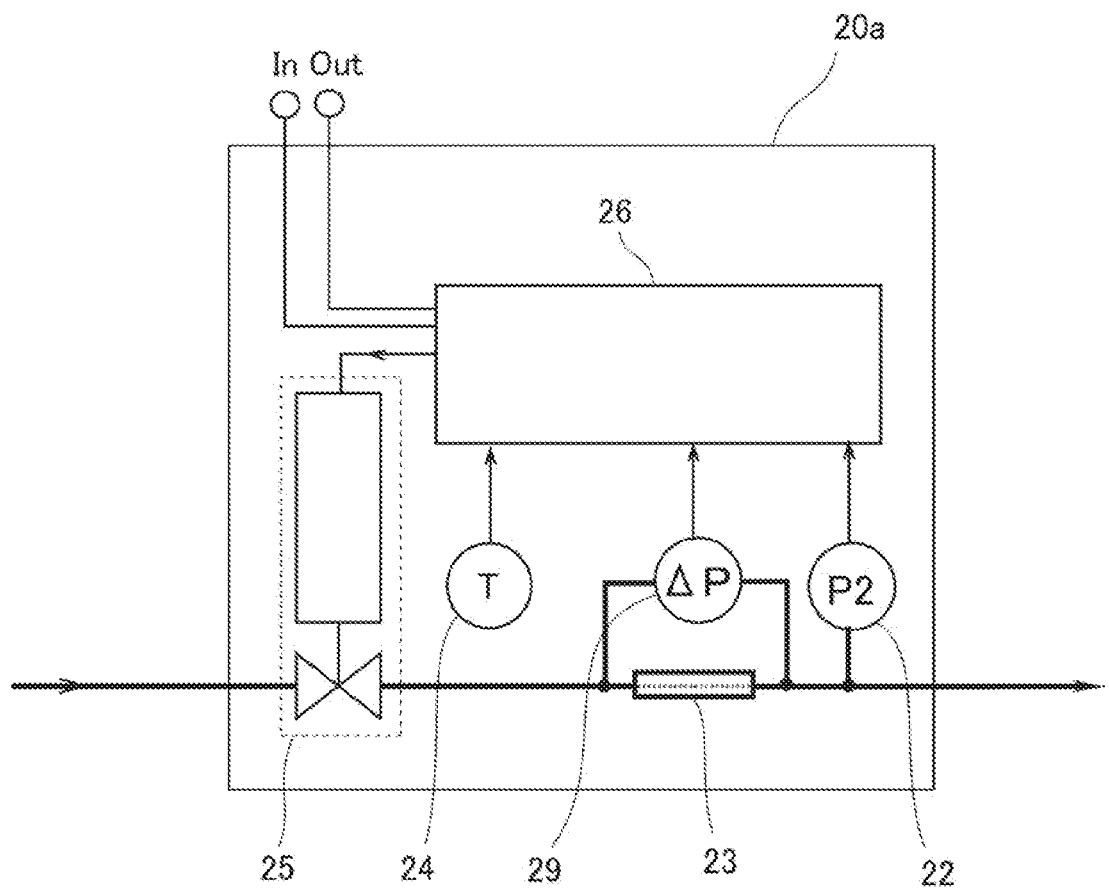
FIG. 9 is a diagram showing a pressure control device according to another embodiment of the present invention.

While the embodiments of the present invention have been described above, various modifications are possible. For example, as shown in FIG. 9, in other embodiments, the pressure control device 20a does not include the first pressure sensor for measuring the upstream pressure P1 but may be configured to include a differential pressure sensor 29 connected to the flow path across the flow resistance 23 together with the second pressure sensor 22.

In the pressure control device 20a, the differential pressure ΔP is measured on the basis of the output of the differential pressure sensor 29, it is possible to measure the flow rate as same as a differential pressure type flow meter, also, it is possible to control the pressure of the gas downstream of the flow resistance 23 based on the output of the second pressure sensor 22. In addition, when determining the flow rate using the upstream pressure P1 and downstream pressure P2 as described above, the flow rate may be obtained by calculation considering the sum of the output from the differential pressure sensor 29 and the output from the second pressure sensor 22 as the upstream pressure P1.

The differential pressure sensor 29 can perform a zero point calibration when the pressure on both sides of the primary side and the secondary side are the same situations even being connected to the flow path, also it has the advantage that an error hardly occurs in the arithmetic flow rate even if the zero point variation occurs (disclosed in International Patent Publication No. WO2020/218138 by the applicant of the present application). Therefore, the accuracy of the flow measurement may be improved in the pressure control device 20a.

In addition, the differential pressure sensor 29 and the second pressure sensor 22 provided in the pressure control device 20a may be integrally formed. In this case, an integrated sensor chip is used, in which the sensor chip is arranged to contact with the downstream pressure chamber connected to the downstream side of the flow resistance 23. In the sensor chip, a vacuum chamber and an upstream pressure chamber connected to the downstream side of the flow resistor 23 are provided isolated from each other. In this configuration, the downstream pressure P2 is obtained from the output of the strain gauge fixed to the diaphragm separating the downstream pressure chamber and the vacuum chamber, also, the differential pressure ΔP is obtained from the output of the strain gauge fixed to the diaphragm separating the downstream pressure chamber and the upstream pressure chamber.

Furthermore, although FIG. 9 shows an embodiment of providing the differential pressure sensor 29 and the second pressure sensor 22, in other embodiments, the first pressure sensor 21 and the differential pressure sensor 29 may be provided, without providing the second pressure sensor 22. In this case, the downstream pressure P2 can be determined by subtracting the output of the differential pressure sensor 29 from the output of the first pressure sensor 21, and the pressure control and flow rate measurement can be performed on the basis of the obtained downstream pressure P2.

INDUSTRIAL APPLICABILITY

The pressure control device according to the embodiment of the present invention is preferably used, for example, to control the pressure of the backside gas supplied to the back surface of the substrate placed in the process chamber, and to measure the flow rate of the backside gas.

REFERENCE SIGNS LIST

1A Process gas supply system
1B Backside gas supply system
5 Substrate
10 Flow rate control device
11 Process gas supply source
12 Upstream valve
13 Downstream valve
14 Vacuum pump
15 Backside gas supply source
16 Orifice member
17 Exhaust valve
18 Vacuum pump
20 Pressure control device
21 First pressure sensor
22 Second pressure sensor
23 Flow resistance
23a Capillary
24 Temperature sensor
25 Pressure control valve
26 Arithmetic control circuit
27 Flow path block
28 Downstream flow path block
29 Differential pressure sensor
30 Process chamber
32 Mount table
34 Suction device
36 Showerhead

The invention claimed is:

1. A pressure control device comprising:
a pressure control valve provided in a flow path;
a flow resistance for restricting a gas flow provided downstream of the pressure control valve;
a first pressure sensor for measuring a gas pressure of the flow path between the pressure control valve and the flow resistance;
a second pressure sensor for measuring a gas pressure of the flow path downstream of the flow resistance; and
an arithmetic control circuit connected to the first pressure sensor and the second pressure sensor,
wherein the arithmetic control circuit is configured to control a gas pressure downstream of the flow resistance by adjusting an opening degree of the pressure control valve based on an output of the second pressure sensor regardless of an output of the first pressure sensor and calculate a flow rate of the gas flowing downstream from the flow resistance based on the outputs of the first pressure sensor and the second pressure sensor,
wherein the flow resistance is a laminar flow element comprising a columnar member and a capillary structure provided in a hole penetrating an axis direction of the columnar member, and
the columnar member has a recess on its end surface for accommodating an enlarged diameter portion of the capillary structure, and a resin gasket is provided between a bottom surface of the recess of the columnar member and a bottom surface of the enlarged diameter portion of the capillary structure.

2. The pressure control device according to claim 1, wherein the pressure control valve is a piezoelectric element driven valve; each of the first pressure sensor and the second pressure sensor is a diaphragm type pressure sensor having a diaphragm as a pressure-sensing portion and an elongated hole communicating to the diaphragm; and any one of diameters of the pressure control valve, the first pressure sensor, the second pressure sensor, and the flow resistance is 10 mm or less.

3. The pressure control device according to claim 1, wherein the pressure control device is connected to a supply flow path for supplying gas to a back surface of a substrate placed in a process chamber, and is configured to control a gas pressure on the back surface of the substrate to a predetermined pressure, and to detect a leakage of gas from the back surface of the substrate into the process chamber based on a calculated flow rate.

4. The pressure control device according to claim 1, being configured so that a controlled gas pressure is to be between 1 and 100 Torr.

5. The pressure control device according to claim 1 comprising:
- a flow path block formed with flow paths by drilling, wherein the pressure control valve and the first pressure sensor are arranged to face each other across the flow path block,
- wherein the flow paths formed in the flow path block include a first flow path extending from a central portion of a valve element of the pressure control valve toward the first pressure sensor, and a second flow path extending branched from the first flow path along a direction intersecting the first flow path, and
- the flow resistance is provided in the second flow path.

6. A pressure control device comprising:
- a pressure control valve provided in a flow path;
- a flow resistance for restricting a gas flow provided downstream of the pressure control valve;
- a first pressure sensor for measuring a gas pressure of the flow path between the pressure control valve and the flow resistance;
- a second pressure sensor for measuring a gas pressure of the flow path downstream of the flow resistance;
- a flow path block formed with flow paths by drilling; and
- an arithmetic control circuit connected to the first pressure sensor and the second pressure sensor,
- wherein the arithmetic control circuit is configured to control a gas pressure downstream of the flow resistance by adjusting an opening degree of the pressure control valve based on an output of the second pressure sensor regardless of an output of the first pressure sensor and calculate a flow rate of the gas flowing downstream from the flow resistance based on the outputs of the first pressure sensor and the second pressure sensor, and
- wherein the pressure control valve and the first pressure sensor are arranged to face each other across the flow path block, the flow paths formed in the flow path block include a first flow path extending from a central portion of a valve element of the pressure control valve toward the first pressure sensor, and a second flow path extending branched from the first flow path along a direction intersecting the first flow path, and the flow resistance is provided in the second flow path.

* * * * *